United States Patent
Chia

(10) Patent No.: US 7,728,683 B2
(45) Date of Patent: Jun. 1, 2010

(54) PHASE RECOVERY CIRCUIT

(75) Inventor: Ju-Lin Chia, Hsin-Chu (TW)

(73) Assignee: Leadtrend Technology Corp., Hsin-Chu (TW)

(*) Notice: Subject to any disclaimer, the term of this patent is extended or adjusted under 35 U.S.C. 154(b) by 26 days.

(21) Appl. No.: 12/276,427

(22) Filed: Nov. 24, 2008

(65) Prior Publication Data
US 2009/0295444 A1    Dec. 3, 2009

(30) Foreign Application Priority Data
May 30, 2008    (TW)    ................. 97120205 A

(51) Int. Cl.
*G05F 1/00*    (2006.01)
*H03B 5/04*    (2006.01)
*H03K 3/03*    (2006.01)
*H03L 1/00*    (2006.01)

(52) U.S. Cl. .................... 331/175; 331/57; 331/173; 323/222

(58) Field of Classification Search ............... 331/55, 331/57, 145, 149, 153, 172, 173, 175, 176; 323/222
See application file for complete search history.

(56) References Cited

U.S. PATENT DOCUMENTS 4,268,793 A * 5/1981 Amazawa et al. ........... 327/384

* cited by examiner

*Primary Examiner*—David Mis
(74) *Attorney, Agent, or Firm*—Winston Hsu

(57) ABSTRACT

A phase recovery circuit for avoiding noise interfering with the clock signal generated from an oscillator is disclosed. The phase recovery circuit includes a noise detector, a phase detector, and a phase locker. The noise detector detects noise and accordingly generates a noise detecting signal. The phase detector is triggered by the noise detecting signal for detecting the phase of the clock signal and accordingly generating a phase detecting signal. The phase locker locks the phase of the clock signal to a predetermined phase within a predetermined period after the occurrence of the noise detecting signal, and after the predetermined period, the phase locker releases the clock signal. In this way, the phase of the clock signal is not affected by noise.

21 Claims, 7 Drawing Sheets

PHASE RECOVERY CIRCUIT

BACKGROUND OF THE INVENTION

1. Field of the Invention

The present invention relates to an oscillator, and more particularly, to an oscillator free from being interfered by a noise signal.

2. Description of the Prior Art

Please refer to FIG. 1. FIG. 1 is a diagram illustrating an oscillator 100 according to the prior art. The conventional oscillator 100 is a ring oscillator with odd numbers of inverters connected in series, and each of the inverters couples between a voltage source $V_{DD}$ (providing a voltage $V_{DD}$) and a voltage source $V_{SS}$ (providing a voltage $V_{SS}$) respectively. Voltage source $V_{DD}$ in FIG. 1 is served as a power source while voltage source $V_{SS}$ is served as a ground end (e.g., GND). In addition, the conventional oscillator 100 can further include a buffer B coupled to an output end of the oscillator 100, for receiving a clock signal CLK and buffering clock signal CLK to generate a clock signal $CLK_B$ accordingly. Buffer B can be implemented by an amplifier or a comparator. Additionally, In FIG. 1, buffer B is used to enhance signal magnitude of clock signal CLK, thereby generating clock signal $CLK_B$ with a stronger driving ability than clock signal CLK, or, adjusting waveform of clock signal CLK to generate clock signal $CLK_B$ with a square wave more perfectly. In this way, the improved clock signal $CLK_B$ hence is more suitable for follow-up process.

However, oscillator 100 generates clock signal CLK with errors, e.g. phase errors, when noise signals exist on voltage source $V_{DD}$ and/or voltage source $V_{SS}$.

Please refer to FIG. 2, a diagram illustrating a first condition of clock signal CLK while being interfered by a noise signal carried from the voltage source (i.e., $V_{DD}$ or $V_{SS}$). As shown in FIG. 2, when the noise signal exists on voltage source VDD or voltage source VSS, clock signal CLK, which originally ought to keep logically high at this time, is changed to be logically low, owing to the interference from the noise signal. In such condition, the clock signals CLK interfered by the noise signal may be unsuitable for use.

Please refer to FIG. 3; a diagram illustrating a second condition of clock signal CLK interfered by the noised signal. As shown in FIG. 3, the dashed line indicates that clock signal CLK should be changed to logically low. However, the noise signal exists on voltage sources $V_{DD}/V_{SS}$, clock signal CLK, at this time, and hence keeps clock signal CLK logically high rather than logically low. In such condition, clock signal CLK interfered by the noise signal may be insuitable for use as well.

SUMMARY OF THE INVENTION

An embodiment of the present invention provides a phase recovery circuit for protecting an oscillator from being interfered by a noise signal. The oscillator generates a clock signal via an output end therein. The phase recovery circuit comprises a noise detector, a phase detector, and a phase locker. The noise detector is for detecting the noise signal and generating a noise detecting signal accordingly. The phase detector is triggered by the noise detecting signal for detecting a phase of the clock signal and generating a phase detecting signal accordingly. The phase locker is for locking the clock signal and releasing the clock signal according to the phase detecting signal. The phase locker locks the clock signal to a predetermined phase within a predetermined period after occurrence of the noise detecting signal and releases the clock signal after the predetermined period, thereby avoiding the phase of the clock signal from being interfered by the noise signal in the predetermined period.

An embodiment of the present invention provides an oscillator. The oscillator comprises a ring oscillator, a noise detector, a phase detector, and a phase locker. The ring oscillator comprises a plurality of inverters connected in series. An output end of one inverter of the plurality of the inverters generates a clock signal. The noise detector is for detecting a noise signal and generating a noise detecting signal accordingly. The phase detector is triggered by the noise detector for detecting a phase of the clock signal and generating a phase detecting signal accordingly. The phase locker is for locking the clock signal and releasing the clock signal according to the phase detecting signal. The phase locker locks the clock signal to a predetermined phase within a predetermined period after occurrence of the noise detecting signal and releases the clock signal after the predetermined period, thereby avoiding the phase of the clock signal from being interfered by the noise signal in the predetermined period.

An embodiment of the present invention provides a method for recovering a phase of a clock signal. The method avoids the clock signal from being interfered by a noise signal. The method comprises detecting the noise signal for generating a noise detecting signal, detecting the phase of the clock signal according to the noise detecting signal for outputting a phase detecting signal, locking the clock signal to a predetermined phase according to the phase detecting signal, and releasing the clock signal after a predetermined period of occurrence of the noise detecting signal, thereby avoiding the phase of the clock signal from being interfered by the noise signal in the predetermined period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
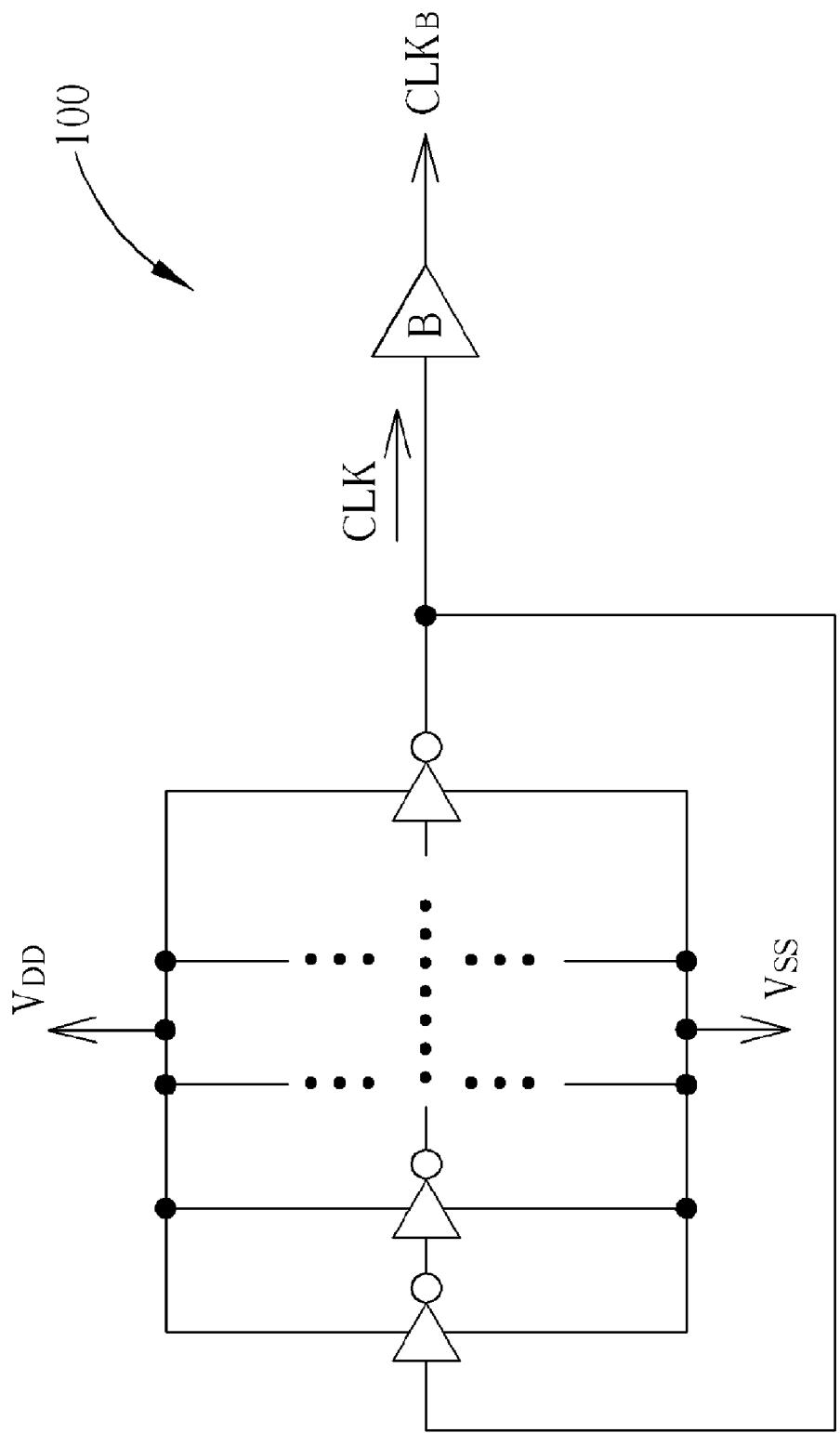
FIG. 1 is a diagram illustrating an oscillator according to the prior art.
Figure 2:
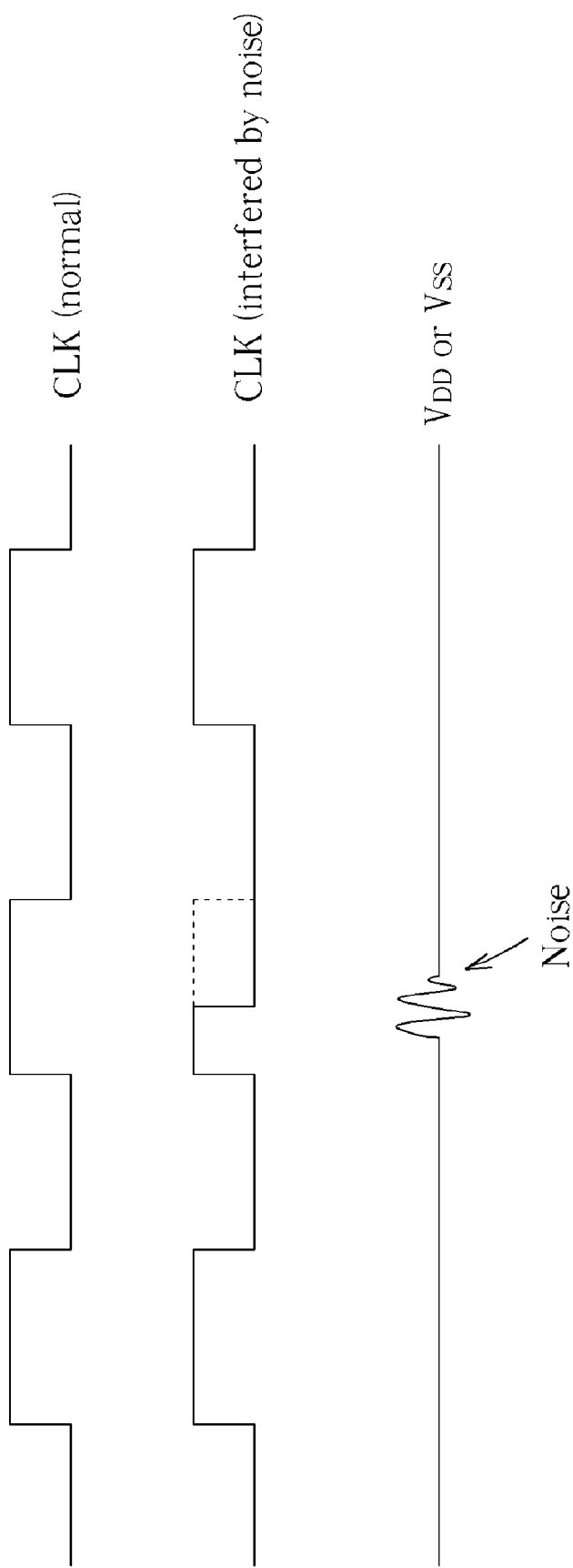
FIG. 2 is a diagram illustrating a first condition of the clock signal being interfered by the noised signal.
Figure 3:
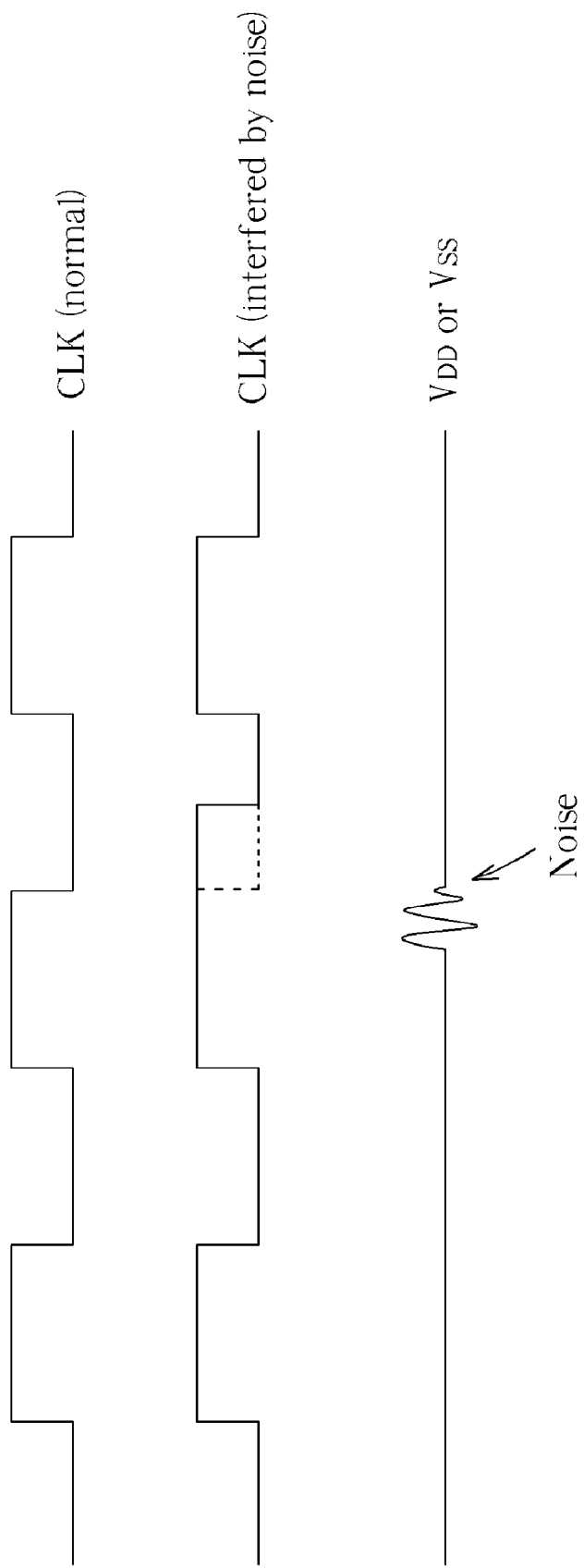
FIG. 3 is a diagram illustrating a second condition of the clock signal being interfered by the noised signal.
Figure 4:
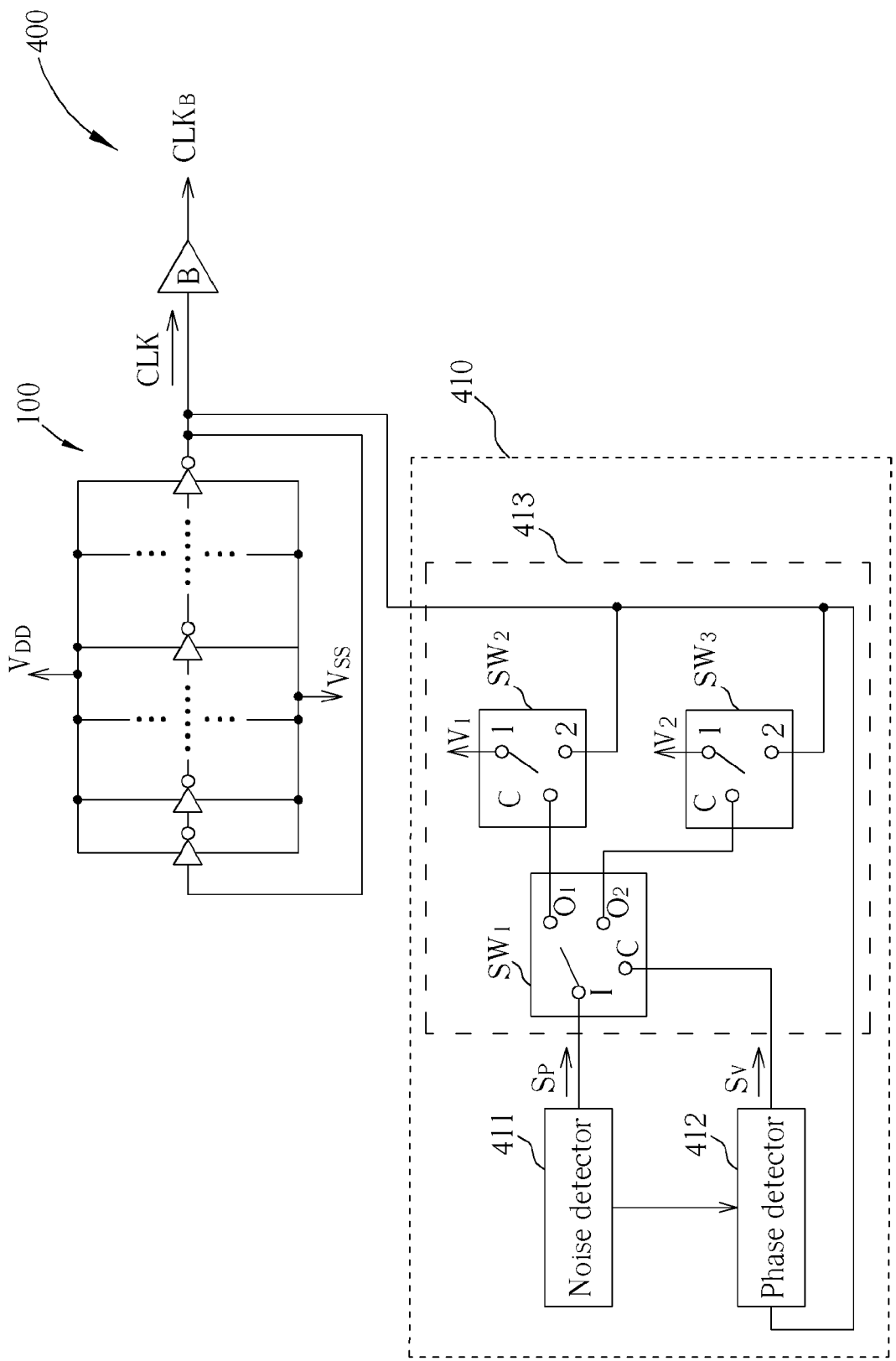
FIG. 4 is a diagram illustrating an embodiment of a robust oscillator according to the present invention.

Please refer to FIG. 4. FIG. 4 is a diagram illustrating an embodiment of a robust oscillator 400 according to the present invention. As shown in FIG. 4, the oscillator 400 includes an oscillator 100 and a phase recovery circuit 410. Since the associated operation and functionality of the oscillator 100 are well known to people skilled in this art, further description is omitted here for the sake of brevity; for instance, in some embodiment, the oscillator 100 is a ring oscillator and includes odd numbers of inverters connected in series; in addition, according to different design requirements, the oscillator 100 could further include a buffer B. Phase recovery circuit 410 includes a noise detector 411, a phase detector 412, and a phase locker 413.

Noise detector 411 is disposed for detecting occurrence of the noise signal on voltage source $V_{DD}$ and/or $V_{SS}$. Noise detector 411 generates a noise detecting signal $S_P$ if the noise signal is determined as being existing on voltage sources $V_{DD}/V_{SS}$. In some embodiments of the present invention, noise detector 411 directly detects magnitude of the noise signal existing on the voltage sources $V_{DD}/V_{SS}$ and then generates noise detecting signal $S_P$ accordingly. In other embodiments of the present invention, noise detector 411 could generate noise detecting signal $S_P$ in accordance to designers' personal experiences. For example, it may be observed that excessive noise signals on voltage sources $V_{DD}/V_{SS}$, frequently follows the occurrence of specific signals. Hence noise detector 411 could generate noise detecting $S_P$ when the aforementioned specific signals appear. For example, switching for a power switch generally leads to extensive variation in conduction current. Thus, because of parasitic inductors and/or capacitors existing in the related circuits, the extensive variation affects the voltage level of the voltage sources $V_{DD}/V_{SS}$ through the parasitic inductors and/or capacitors. Therefore, to avoid the oscillator 400 being interfered by the noised signals caused by switching of the power switch, noise detector 411 detects the occurrence of the switching signal for switching the power switch, to generate noise detecting signals $S_P$ accordingly. In addition, in some embodiments, noise detecting signal $S_P$ is a single pulse signal, whose pulse width is expressed as $T_{P1}$, which can be determined by an internal counter (not shown).

Phase detector 412 is triggered by noise detecting signal $S_P$ to detect the phase of a clock signal at an output end of oscillator 400 and to accordingly generate a phase detecting signal $S_V$. For example, the output end being detected can be any output end of an inverter of a ring oscillator. Preferably, the output end being detected is the output end of the last inverter of the plurality of the inverters in the ring oscillator. In other words, clock signal CLK outputted from the last inverter of the ring oscillator, being utilized for driving other device, is detected by phase detector 412.

Phase detecting signal $S_V$ is set to be at a predetermined voltage $V_L$ when phase detector 412 determines that the phase of the clock signal received by phase detector 412 is at low phase (the voltage level of the clock signal is lower than a first predetermined value). On the other hand, phase detecting signal $S_V$ is set to be at another predetermined voltage $V_H$ when phase detector 412 determines that the phase of the clock signal received by phase detector 412 is at high phase (the voltage of the clock signal is higher than a second predetermined value). The first predetermined value and the second predetermined value can be identical to each other, or, the first predetermined value can be lower than the second predetermined value. These design variances depend on different design requirements and fall within scope of the present invention. Supposing in one embodiment, the oscillator 100 includes M inverters and, the output end of the $M^{th}$ inverter (the last inverter of the oscillator 100) is coupled to the input end of the $I_{st}$ inverter (the first inverter of the oscillator 100) and to other circuits; phase detector 412 can selectively couple to the output end of any other inverters of the oscillator 100, but preferably couple to the output end of the $M^{th}$ inverter of oscillator 100 for receiving clock signal CLK. Phase detector 412 hence is capable of determining whether the outputted clock signal from the $M^{th}$ inverter is at high/low phase for accordingly generating phase detecting signal $S_V$. For the sake of brevity, in the following description, phase detector 412 is coupled to the output end of the $M^{th}$ inverter.

Phase locker 413 includes three switches $SW_1$, $SW_2$, and $SW_3$. Phase locker 413 locks clock signal CLK to a predetermined phase (a predetermined voltage level) or keeps clock signal CLK at the phase (voltage level) detected by phase detector 412 within a predetermined period $T_{P2}$ after the occurrence of phase detecting signal $S_P$. The predetermined phase has to be set the same as the detected phase of the clock signal CLK. In other words, the predetermined phase is high if the phase detected by phase detector 412 is high, and the predetermined phase is low if the phase detected by phase detector 412 is low. In this way, the phase of clock signal CLK is free from being interfered by noise signals that possibly exist on the voltage sources $V_{DD}/V_{SS}$ in the predetermined period $T_{P2}$. When no noise signals are expected after the predetermined period $T_{P2}$, noise locker 412 then releases clock signal CLK. In phase locker 413, switch $SW_1$ is controlled by phase detecting $S_V$ for transmitting noise detecting signal $S_P$ to switches $SW_2$ or $SW_3$ so as to turn on switches $SW_2$ or $SW_3$. The turned-on switch (i.e., $SW_2$ or $SW_3$) then locks clock signal CLK to the predetermined high/low phase within predetermined period $T_{P2}$. After predetermined period $T_{P2}$, the phase locker 413 releases clock signal CLK. In this way, the interference caused by the noise signal with clock signal CLK can be reduced. Additionally, it is suggested that predetermined period $T_{P2}$ is shorter than the cycle of clock signal CLK for avoiding affecting the phase of clock signal CLK and causing phase errors. The value of predetermined period $T_{P2}$ can be set as the same as pulse width $T_{P1}$ of noise detecting signal $S_P$. Phase locker 413, as shown in FIG. 4, is not limited to include the aforementioned switches $SW_1$, $SW_2$, and $SW_3$. Other elements and configuration is possible according to the design requirements for realizing phase locker 413.

Switch $SW_1$ includes a control end C, an input end I, and two output ends $O_1$ and $O_2$. Input end I of switch $SW_1$ is coupled to the output end of noise detector 411 for receiving noise detecting signal $S_P$. Control end C of switch $SW_1$ is coupled to the output end of the phase detector 412 for receiving phase detecting signal $S_P$. Output end $O_1$ of switch $SW_1$ is coupled to control end C of switch $SW_2$. Output end $O_2$ of switch $SW_1$ is coupled to control end C of switch $SW_3$. Switch $SW_1$ transmits noise detecting signal $S_P$ to output ends $O_1$ or $O_2$ of switch $SW_1$ according to phase detecting signal $S_V$. More particularly, input end I of switch $SW_1$ is coupled to output end $O_1$ of switch $SW_1$ for transmitting noise detecting signal $S_P$ to control end C of switch $SW_2$ when phase detecting signal $S_V$ is at predetermined voltage level $V_H$ (the phase of clock signal CLK is determined "high"); input end I of switch $SW_1$ is coupled to output end $O_2$ of switch $SW_1$ for transmitting noise detecting signal $S_P$ to control end C of switch $SW_3$ when phase detecting signal $S_V$ is at predetermined voltage level $V_L$ (the phase of clock signal CLK is determined "low").

Switch $SW_2$ includes a control end C, a first end 1 and a second end 2. First end 1 of switch $SW_2$ is coupled to a voltage source $V_1$, and second end 2 of switch $SW_2$ is coupled to the output end of the $M^{th}$ inverter of oscillator 100. The voltage source $V_1$ can be a voltage source that provides a high voltage, or can be identical to the voltage source $V_{DD}$. When output end $O_1$ of switch $SW_1$ outputs noise detecting signal $S_P$, which means switch $SW_2$ receives noise detecting signal $S_P$, switch $SW_2$ is turned on and first end 1 of switch $SW_2$ is coupled to second end 2 of switch $SW_2$ so that voltage source $V_1$ is coupled to the output end of the $M^{th}$ inverter of oscillator 100. In this way, the phase of the output signal (i.e., clock signal CLK) outputted via the output end of the M$^{th}$ inverter of oscillator 100 is clamped at a high phase (the voltage level at the time is close to voltage V$_1$ or voltage V$_{DD}$).

Switch SW$_3$ includes a control end C, a first end 1 and a second end 2. First end 1 of switch SW$_3$ is coupled to a voltage source V$_2$, and second end 2 of switch SW$_3$ is coupled to the output end of the M$^{th}$ inverter of the oscillator 100. The voltage source V$_2$ can be a voltage source that provides a low voltage, or can be identical to the voltage source V$_{SS}$ (GND). When output end O$_2$ of switch SW$_1$ outputs noise detecting signal S$_P$, which means switch SW$_3$ receives noise detecting signal S$_P$, switch SW$_3$ is turned on and first end 1 of switch SW$_3$ is coupled to second end 2 of switch SW$_3$ so that voltage source V$_2$ is coupled to the output end of the M$^{th}$ inverter of oscillator 100. In this way, the phase of the output signal (i.e., clock signal CLK) outputted via the output end of the M$^{th}$ inverter of oscillator 100 is clamped at a low phase (the voltage level at the time is close to voltage V$_2$ or voltage V$_{SS}$).

In this way, noise detector 412 generates noise detecting signal S$_P$ when the noise signal exists on voltage sources V$_{DD}$/V$_{SS}$ or the noise signal is about to exist on voltage sources V$_{DD}$/V$_{SS}$. Phase detector 412 controls switch SW$_1$ to selectively turn on switches SW$_2$ or SW$_3$ according to the phase (high or low) of the output signal from the output end of the M$^{th}$ inverter of oscillator 100 so as to clamp the phase of the output signal (clock signal CLK) of the M$^{th}$ inverter in oscillator 100 to be at the corresponding high or low phase. Thus, at the time when the output signal of the M$^{th}$ inverter of the oscillator 100 is clamped, the output signal of the M$^{th}$ inverter of oscillator 100 is kept at the correct high/low phase rather than changed to incorrect phases. In other words, phase recovery circuit 410 detects and locks the phase of the output signal (clock signal CLK) when noise signals might occur on voltage sources V$_{DD}$/V$_{SS}$, and then releases clock signal CLK for allowing oscillator 100 to oscillate and continue outputting clock signal CLK after predetermined period T$_{P2}$ when the noise signals are expected to vanish. Clock signal CLK generated by the oscillator 400 therefore is free from the interference of the aforementioned noise signals.

Figure 5:
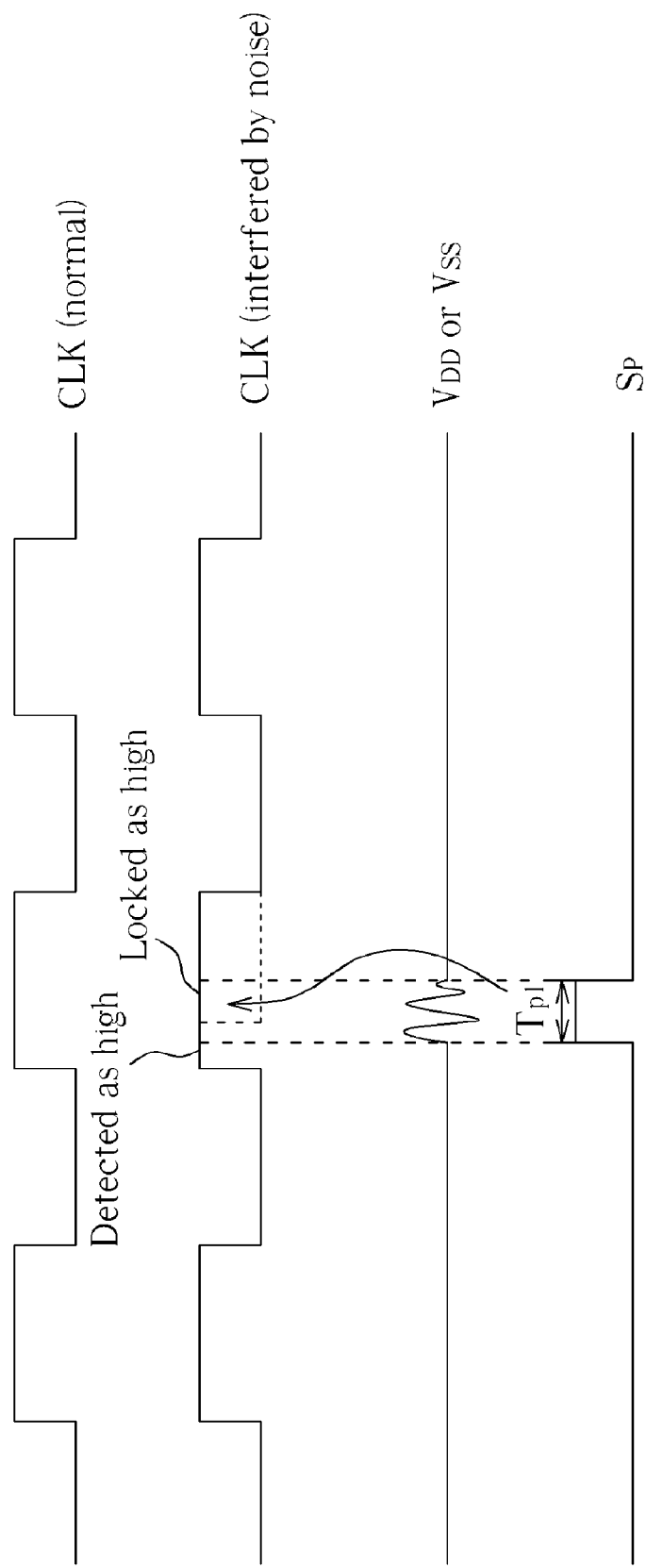
FIG. 5 is a timing diagram illustrating the relationship between the noise detecting signal and the clock signal according to the present invention.

Please refer to FIG. 5. FIG. 5 is a timing diagram illustrating the relationship between noise detecting signal S$_P$ and clock signal CLK according to the present invention. In this embodiment, it is assumed that phase detector 412 is coupled to the output end of the M$^{th}$ inverter of oscillator 100 (that is, the output end of the M$^{th}$ inverter is selected as the output end of the oscillator 100 to output clock signal CLK). When the noise signal exists or is about to exist on voltage sources V$_{DD}$/V$_{SS}$, phase detector 412 detects the phase of clock signal CLK. As shown in FIG. 5, phase detector 412 detects the phase of clock signal CLK at this time being high; phase detector 412 hence transmits phase detecting signal S$_P$ having voltage level V$_H$ to control end C of switch SW$_1$ so as to couple the voltage source V$_1$ to the output end of the oscillator 100 for locking the phase of clock signal CLK to a corresponding high voltage level V$_1$ (V$_{DD}$), which means a high phase. In this way, clock signal CLK keeps the correct phase rather than being interfered by the noise signals and changed to the incorrect phase. Furthermore, predetermined period T$_{P1}$ varies depending on different design requirements. Predetermined period T$_{P1}$ could be set to be longer than that of the noise signal existing on voltage sources V$_{DD}$/V$_{SS}$. Predetermined period T$_{P1}$ is suggested to be must smaller than a cycle of clock signal CLK for avoiding causing phase errors to clock signal CLK.

Figure 6:
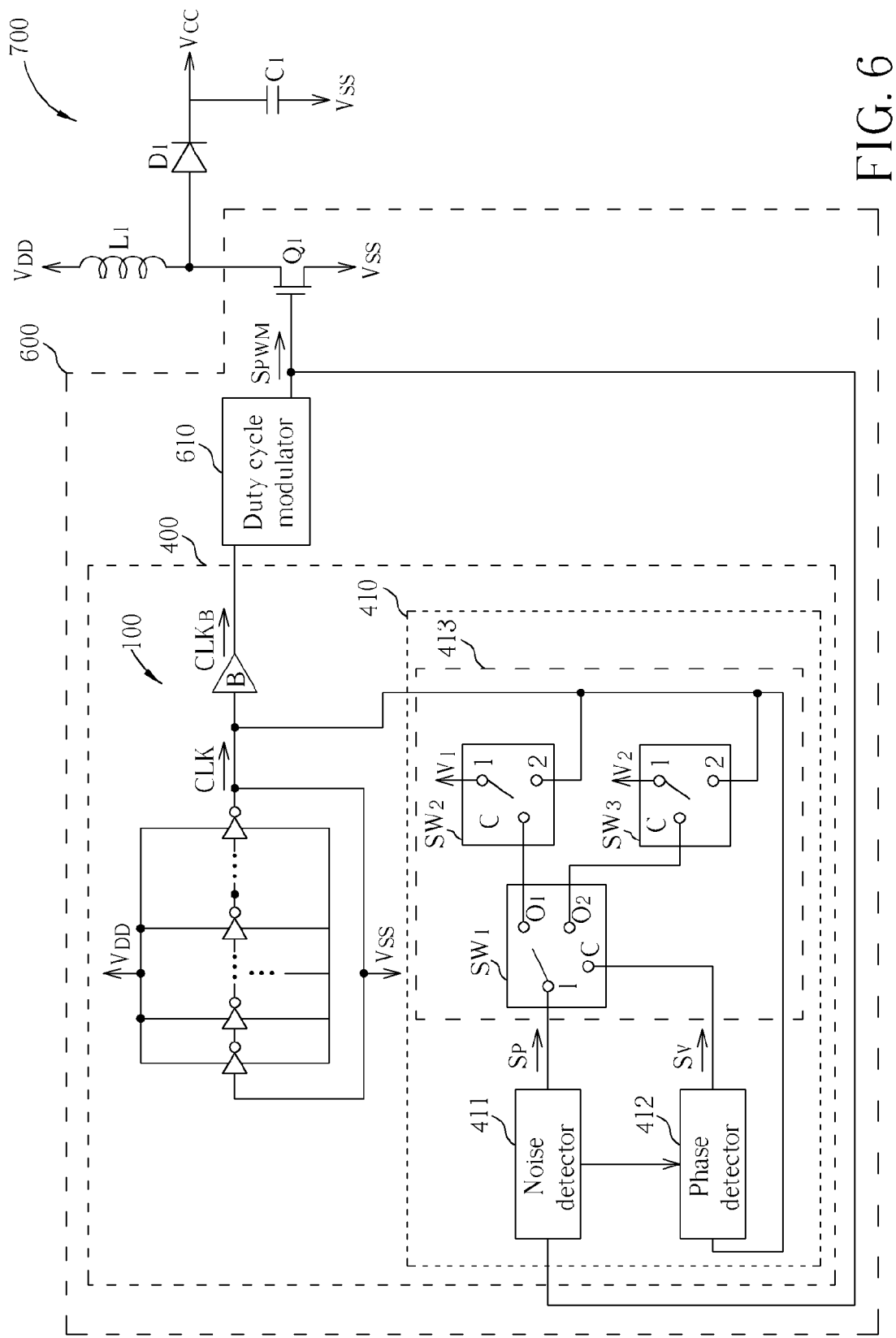
FIG. 6 is a diagram illustrating a switching regulator with the disclosed oscillator according to an embodiment of the present invention.

Please refer to FIG. 6. FIG. 6 is a diagram illustrating a switching regulator 700 with the disclosed oscillator 400 according to the present invention. The switching regulator 700 includes a power management circuit 600, an inductor L$_1$, a diode D$_1$, and a capacitor C$_1$. As shown in FIG. 6, switching regulator 700 converts a voltage source V$_{DD}$ to a voltage source V$_{CC}$ (providing an output voltage V$_{CC}$). In this embodiment, the switching regulator 700 is a voltage booster.

Power management circuit 600 includes a power switch Q$_1$, a duty cycle modulator 610, and an oscillator 400. In this embodiment, the power switch Q$_1$ is realized with an N channel Metal Oxide Semiconductor (NMOS) transistor. Oscillator 400 generates clock signal CLK and provides the outputted clock signal CLK to duty cycle modulator 610. Duty cycle modulator 610 receives clock signal CLK$_B$ (substantially identical to clock signal CLK) and adjusts the duty cycle of clock signal CLK$_B$ accordingly to thereby generate a switching signal S$_{PWM}$. Duty cycle modulator 610 adjusts the duty circle of clock signal CLK$_B$ according to the amplitude of voltage V$_{CC}$ for generating switching signal S$_{PWM}$, which allows power switch Q$_1$ to be turned on/off appropriately and accordingly to generate the desired voltage V$_{CC}$.

A control end (gate) of power switch Q$_1$ is coupled to the output end of duty cycle modulator 610 for receiving switching signal S$_{PWM}$; a first end of power switch Q$_1$ is coupled to inductor L$_1$; a second end of power switch Q$_1$ is coupled to voltage source V$_{SS}$ (ground end). Power switch Q$_1$ is turned off when the voltage level of switching signal S$_{PWM}$ is low, and inductor L$_1$ hence is not coupled to voltage source V$_{SS}$ accordingly; power switch Q$_1$ is turned on when the voltage level of switching signal S$_{PWM}$ is high and thereby makes inductor L$_1$ couple to voltage source V$_{SS}$, which means that voltage source V$_{SS}$ and the voltage source V$_{DD}$ at this time are coupled to each other through inductor L$_1$. The current passing through power switch Q$_1$ varies from a large current to a small one suddenly when the switching signal S$_{PWM}$ falls down to a low voltage level from a high voltage level (i.e., a falling edge of switching signal S$_{PWM}$). Under such condition, voltage source V$_{SS}$ is easily to be interfered by this big current variance on power switch Q$_1$ and the noise signal probably occurs on voltage source V$_{SS}$. Besides, there may be other situations causing the noise signal existing on voltage sources V$_{DD}$/V$_{SS}$.

Inductor L$_1$ is coupled between voltage source V$_{DD}$ and the first end (drain) of power switch Q$_1$. Diode D$_1$ is coupled between the first end of power switch Q$_1$ and voltage source V$_{CC}$. Capacitor C1 is coupled between voltage sources V$_{CC}$ and V$_{SS}$. Since the functional operations and structure of the switching regulator 700 are well known to those skilled in this art, further description is omitted for the brevity.

AS shown in FIG. 6, the output end of duty cycle modulator 610 is further coupled to the input end of noise detector 411. That is, noise detector 411 determines the occurrence of noise signals according to switching signal S$_{PWM}$. As mentioned above, the noise signal might exist on voltage source V$_{SS}$ while power switch Q$_1$ is turned off. For protecting oscillator 400 from the interference of the noise signal, noise detector 411 generates noise detecting signal S$_P$ by detecting the moment that power switch Q$_1$ is being turned off, (i.e., detecting the falling edges of switching signal S$_{PWM}$) to lock the phase of the clock signal of oscillator 100 during a predetermined period.

However, the present invention can also apply into other switching regulators as a voltage bulk circuit or a voltage bulk/boost circuit. In addition, the present invention can also be adopted for any clock generators for protecting the clock signal from being interfered by the noise signals.

Figure 7:
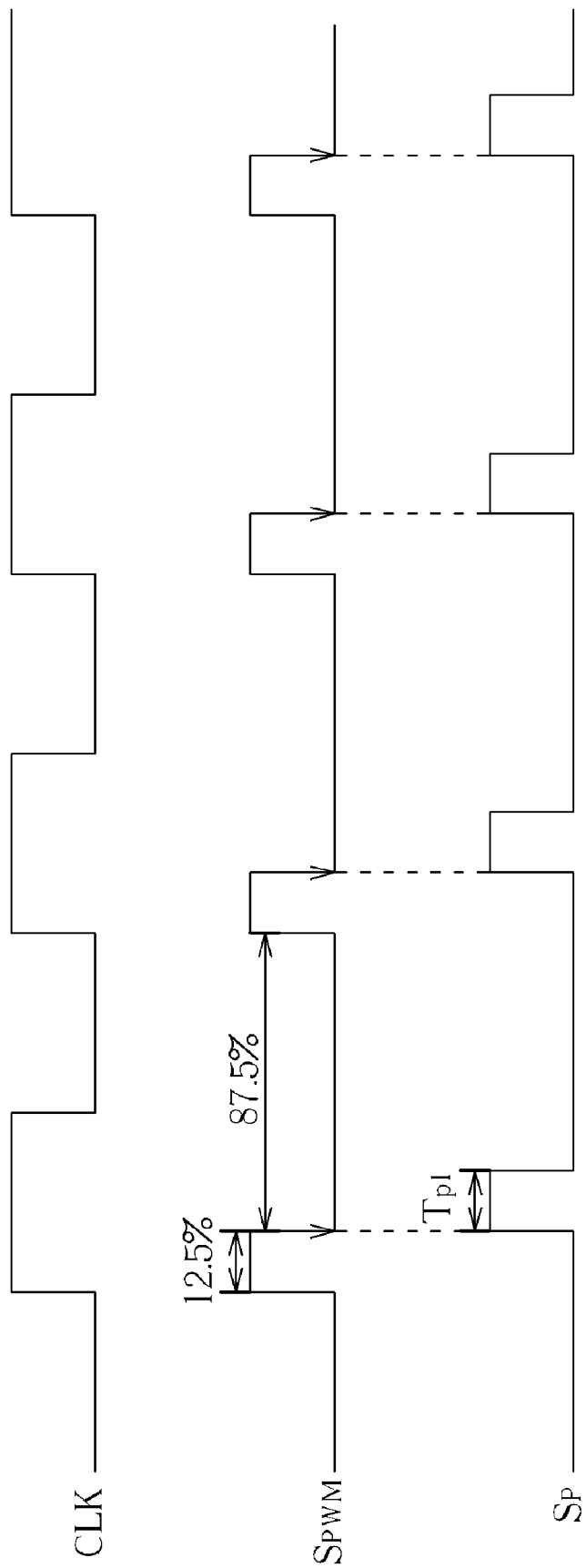
FIG. 7 is a timing diagram illustrating the relationship between the switching signal and the noise detecting signal.

Please refer to FIG. 7, FIG. 7 is a timing diagram illustrating the relationship between switching signal S$_{PWM}$ and noise detecting signal $S_P$. AS shown in FIG. 7, duty cycle modulator 610 sets the duty ratio of the switching signal $S_{PWM}$ to be high by 12.5% of the duty cycle (one cycle of clock signal CLK) and be low by 87.5% of the duty cycle. It means the power switch $Q_1$ is only turned on for 12.5% within one cycle of clock signal CLK and is turned off for 87.5% within one cycle of clock signal CLK. In addition, noise detecting signal $S_P$ can be set according to switching signal $S_{PWM}$. In this embodiment, noise detecting signal $S_P$ is triggered in accordance with the falling edges of switching signal $S_{PWM}$. As shown in FIG. 7, a single pulse signal with predetermined period $T_{P1}$ is served as noise detecting signal $S_P$ after each falling edge of switching signal $S_{PWM}$. Since each falling edge of switching signal $S_{PWM}$ turns off the power switch $Q_1$, the noise signals probable occur on voltage source $V_{SS}$ after switching signal $S_{PWM}$ falls down. In this way, noise detecting signal $S_P$ controls the operations of phase locker 413 for protecting the oscillator 100 from being interfered by the noise signals.

In conclusion, the oscillator of the present invention is robust to the noise signals and hence improves the performance of the clock signals, and the power management circuit adopting the aforementioned robust oscillator improves the stability of the switching signal and the performance of the output voltage.

Those skilled in the art will readily observe that numerous modifications and alterations of the device and method may be made while retaining the teachings of the invention.

What is claimed is:

1. A phase recovery circuit for protecting an oscillator from being interfered by a noise signal, the oscillator generating a clock signal via an output end therein, the phase recovery circuit comprising:
   a noise detector, for detecting the noise signal and generating a noise detecting signal accordingly;
   a phase detector, triggered by the noise detecting signal, for detecting a phase of the clock signal and generating a phase detecting signal accordingly; and
   a phase locker, for locking the clock signal and releasing the clock signal according to the phase detecting signal, the phase locker locking the clock signal to a predetermined phase within a predetermined period after occurrence of the noise detecting signal and releasing the clock signal after the predetermined period, thereby avoiding the phase of the clock signal from being interfered by the noise signal in the predetermined period.

2. The phase recovery circuit of claim 1, wherein the phase locker comprises a first switch, a second switch, and a third switch; wherein the first switch is controlled by the phase detecting signal, for selectively turning on the second switch or the third switch; when the second switch is turned on, the second switch couples the output end of the oscillator to a first voltage source in the predetermined period; when the third switch is turned on, the third switch couples the output end of the oscillator to a second voltage source in the predetermined period.

3. The phase recovery circuit of claim 2, wherein the first switch is controlled by the phase detecting signal, for selectively transmitting the noise detecting signal to the second switch for turning on the second switch or the third switch for turning on the third switch.

4. The phase recovery circuit of claim 2, wherein the first voltage source provides a high voltage, and the second voltage source provides a low voltage.

5. The phase recovery circuit of claim 4, wherein the phase detecting signal controls the first switch to turn on the second switch when the phase detector detects the phase of the clock signal being high.

6. The phase recovery circuit of claim 4, wherein the phase detecting signal controls the first switch to turn on the third switch when the phase detectors detects the phase of the clock signal being low.

7. The phase recovery circuit of claim 1, wherein the noise detecting signal is a single pulse signal, and pulse width of the single pulse signal is the predetermined period.

8. The phase recovery circuit of claim 1, wherein the predetermined period is smaller than a cycle of the clock signal.

9. An oscillator, comprising:
   a ring oscillator, comprising a plurality of inverters connected in series, an output end of one inverter of the plurality of the inverters generating a clock signal;
   a noise detector, for detecting a noise signal and generating a noise detecting signal accordingly;
   a phase detector, triggered by the noise detector, for detecting a phase of the clock signal and generating a phase detecting signal accordingly; and
   a phase locker for locking the clock signal and releasing the clock signal according to the phase detecting signal, the phase locker locking the clock signal to a predetermined phase within a predetermined period after occurrence of the noise detecting signal and releasing the clock signal after the predetermined period, thereby avoiding the phase of the clock signal from being interfered by the noise signal in the predetermined period.

10. The oscillator of claim 9, wherein the phase locker comprises:
   a first switch, comprising:
      an input end, coupled to an output end of the noise detector, for receiving the noise detecting signal;
      a control end, coupled to an output end of the phase detector, for receiving the phase detecting signal;
      a first output end, and
      a second output end;
      wherein the first switch selectively couples the input end of the first switch to the first output end of the first switch or to the second output end of the first switch according to the phase detecting signal;
   a second switch, comprising:
      a first end, coupled to a first voltage source;
      a second end, coupled to the output end of the inverter; and
      a control end, coupled to the first output end of the first switch;
      wherein the first end of the second switch couples to the second end of the second switch when the second switch receives the noise detecting signal via the control end of the second switch; and
   a third switch, comprising:
      a first end, coupled to a second voltage source;
      a second end, coupled to the output end of the inverter; and
      a control end, coupled to the second output end of the first switch;
      wherein the first end of the third switch couples to the second end of the third switch when the third switch receives the noise detecting signal via the control end of the third switch.

11. The oscillator of claim 10, wherein the first voltage source provides a high voltage, and the second voltage source provides a low voltage.

12. The oscillator of claim 11, wherein the phase detecting signal controls the input end of the first switch to couple to the first output end of the first switch when the phase detector detects the phase of the clock signal being high.

13. The oscillator of claim 11, wherein the phase detecting signal controls the input end of the first switch to couple to the second output end of the first switch when the phase detector detects the phase of the clock signal being low.

14. The oscillator of claim 9, wherein the noise detecting signal is a single pulse signal, and pulse width of the single pulse signal is the predetermined period.

15. The oscillator of claim 9, wherein the predetermined period is smaller than a cycle of the clock signal.

16. A power management circuit, for converting a first voltage outputted from a first voltage source into a second voltage as a second voltage source, the power management circuit comprising:
- an oscillator of claim 9;
- a power switch, having a control end, for receiving a switching signal; and
- an inductor, current passing through the inductor being controlled by the power switch;
- wherein the noise detector receives the switch signal and accordingly generates the noise detecting signal.

17. A method for recovering a phase of a clock signal, the method avoiding the clock signal from being interfered by a noise signal, the method comprising:
- detecting the noise signal for generating a noise detecting signal;
- detecting the phase of the clock signal according to the noise detecting signal for outputting a phase detecting signal;
- locking the clock signal to a predetermined phase according to the phase detecting signal; and
- releasing the clock signal after a predetermined period of occurrence of the noise detecting signal, thereby avoiding the phase of the clock signal from being interfered by the noise signal in the predetermined period.

18. The method of claim 17, wherein locking the clock signal to a predetermined phase according to the phase detecting signal comprises:
- locking the clock signal to a predetermined high phase when the phase detecting signal detects the phase of the clock signal being high.

19. The method of claim 17, wherein locking the clock signal to a predetermined phase according to the phase detecting signal comprises:
- locking the clock signal to a predetermined low phase when the phase detecting signal detects the phase of the clock signal being low.

20. The method of claim 17, wherein the noise detecting signal is a single pulse signal, and pulse width of the single pulse signal is the predetermined period.

21. The method of claim 17, wherein the predetermined period is smaller than a cycle of the clock signal.

* * * * *